(12) United States Patent
Takebe

(10) Patent No.: US 11,050,456 B2
(45) Date of Patent: Jun. 29, 2021

(54) RADIO FREQUENCY MODULE AND COMMUNICATION DEVICE

(71) Applicant: Murata Manufacturing Co., Ltd., Kyoto (JP)

(72) Inventor: Masahide Takebe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/082,286

(22) Filed: Oct. 28, 2020

(65) Prior Publication Data

US 2021/0044319 A1 Feb. 11, 2021

Related U.S. Application Data

(63) Continuation of application No. PCT/JP2019/022989, filed on Jun. 10, 2019.

(30) Foreign Application Priority Data

Jun. 28, 2018 (JP) .............................. JP2018-123086

(51) Int. Cl.
*H04B 1/44* (2006.01)
*H04B 1/52* (2015.01)

(52) U.S. Cl.
CPC ..................................... *H04B 1/52* (2013.01)

(58) Field of Classification Search
CPC ... H04B 1/38; H04B 1/44; H04B 1/40; H04B 1/401; H04B 1/005; H04B 1/0053; H04B 1/0057; H04B 1/006; H04B 1/04
See application file for complete search history.

(56) References Cited

U.S. PATENT DOCUMENTS

2014/0321312 A1   10/2014   Narahashi et al.
2015/0028963 A1   1/2015    Ebihara et al.
(Continued)

FOREIGN PATENT DOCUMENTS

JP    2014017750 A    1/2014
JP    2015029233 A    2/2015
(Continued)

OTHER PUBLICATIONS

International Search Report issued in Application No. PCT/JP2019/022989, dated Aug. 13, 2019.
(Continued)

*Primary Examiner* — Tuan Pham
(74) *Attorney, Agent, or Firm* — Pearne & Gordon LLP

(57) ABSTRACT

Band A (Tx) includes Band C (Tx), and Band B (Rx) includes Band C (Rx). A radio frequency module includes: a switch including a first common terminal and first, second, and third selection terminals; a transmit filter for Band A (Tx) and a receive filter for Band B (Rx), which are connected to the first selection terminal; a transmit filter for Band B (Tx) and a receive filter for Band A (Rx), which are connected to the second selection terminal; and a transmit filter for Band D (Tx) and a receive filter for Band D (Rx), which are connected to the third selection terminal, wherein in the first area, the first common terminal is connected to the first selection terminal and the second selection terminal, and in the second area, the first common terminal is connected to the first selection terminal and the third selection terminal.

11 Claims, 12 Drawing Sheets

(56) References Cited

U.S. PATENT DOCUMENTS

| | | | |
|---|---|---|---|
| 2016/0233895 A1* | 8/2016 | Khlat | H04B 1/0057 |
| 2016/0380652 A1 | 12/2016 | Anthony et al. | |
| 2017/0094608 A1* | 3/2017 | Langer | H04B 1/0057 |
| 2018/0138930 A1* | 5/2018 | King | H04B 1/0057 |
| 2018/0343000 A1 | 11/2018 | Nosaka | |

FOREIGN PATENT DOCUMENTS

| | | |
|---|---|---|
| JP | 2017017691 A | 1/2017 |
| WO | 2017138539 A1 | 8/2017 |

OTHER PUBLICATIONS

Written Opinion issued in Application No. PCT/JP2019/022989, dated Aug. 13, 2019.

* cited by examiner

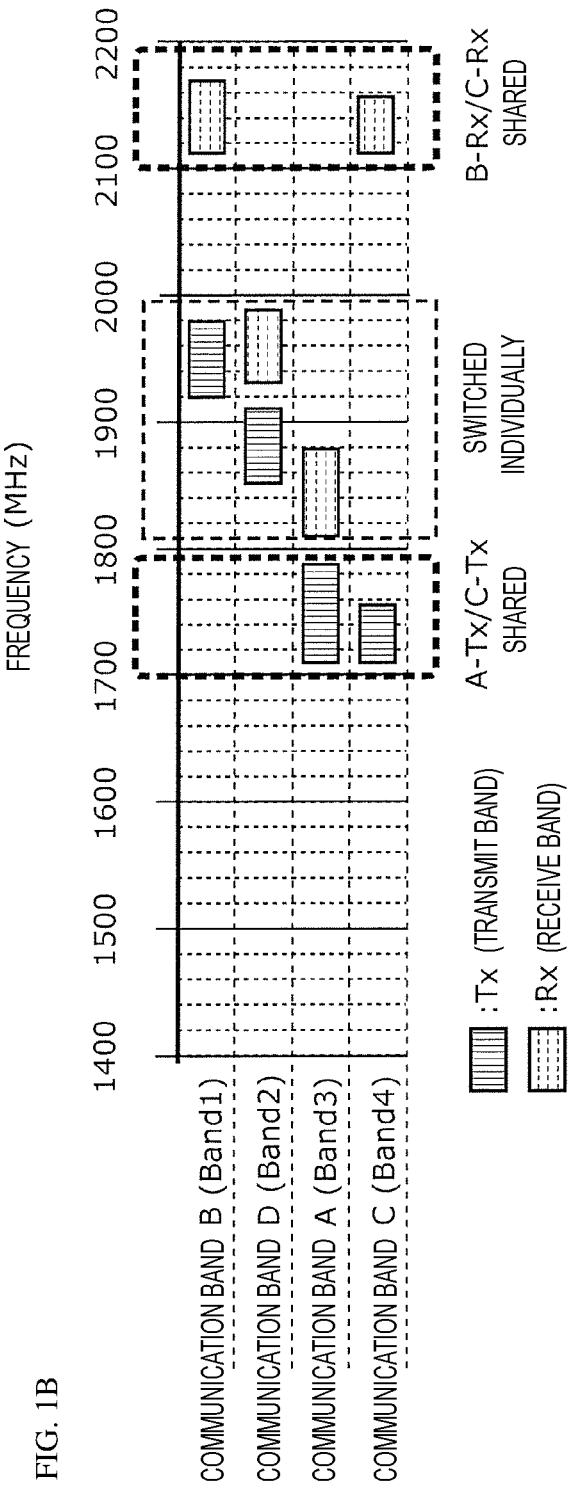

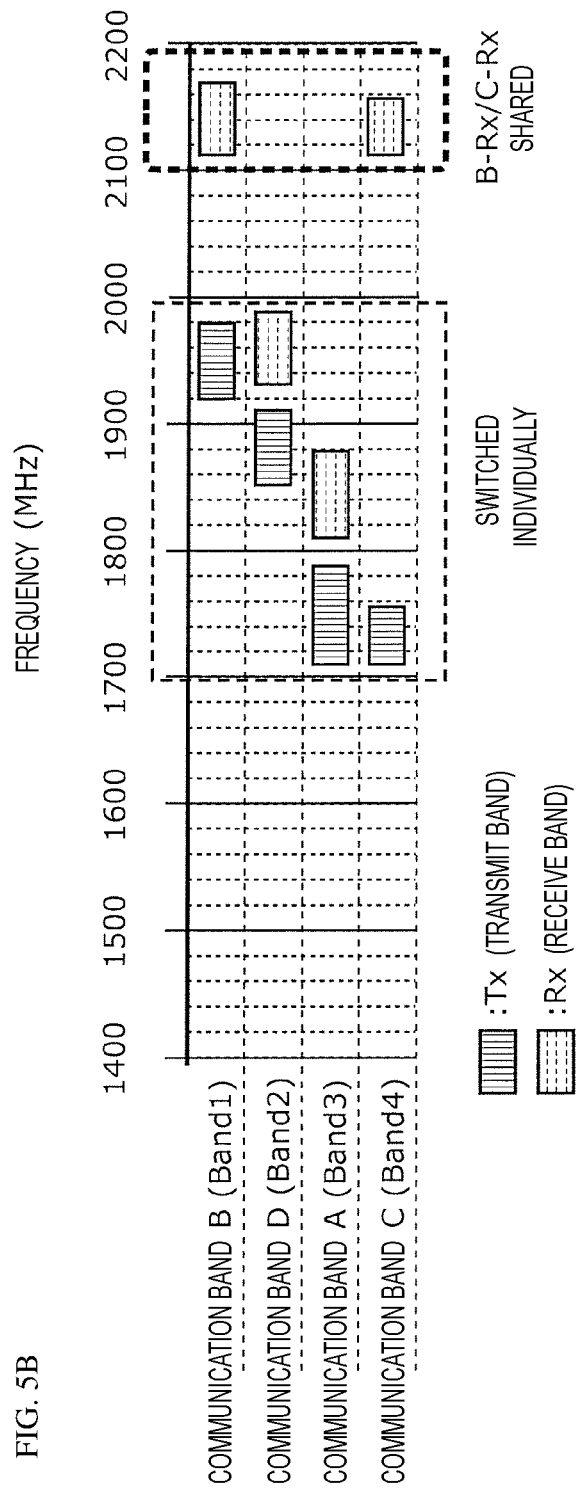

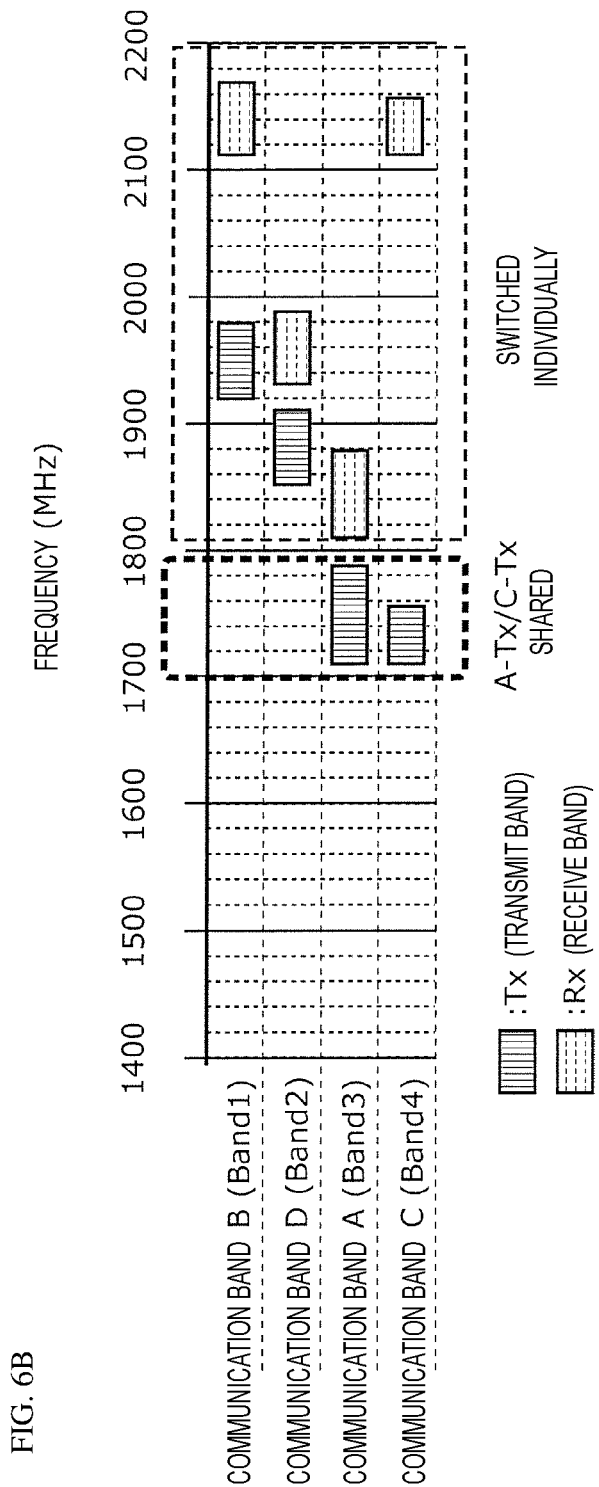

RADIO FREQUENCY MODULE AND COMMUNICATION DEVICE

CROSS REFERENCE TO RELATED APPLICATION

This is a continuation of International Application No. PCT/JP2019/022989 filed on Jun. 10, 2019 which claims priority from Japanese Patent Application No. 2018-123086 filed on Jun. 28, 2018. The contents of these applications are incorporated herein by reference in their entireties.

BACKGROUND

The present disclosure relates to radio frequency modules and communication devices.

In recent communication services, carrier aggregation (hereinbelow, referred to as CA) is performed using a plurality of communication bands simultaneously in order to increase the communication throughput.

A radio frequency module capable of performing CA using two communication bands includes, for example, a diplexer, which is made up of a low pass filter whose pass band is a frequency band group on the lower frequency side and a high pass filter whose pass band is a frequency band group on the higher frequency side, and a plurality of band pass filters connected to the diplexer and having pass bands corresponding to respective frequency bands. This configuration enables to perform CA using one communication band belonging to the frequency band group on the lower frequency side and another communication band belonging to the frequency band group on the higher frequency side (for example, Japanese Unexamined Patent Application Publication No. 2017-17691).

BRIEF SUMMARY

When the mode of use (hereinbelow, referred to as "mode") of a cellular phone is different, different communication bands are used. For example, when the area of use (Europe, United states, China, Japan, or the like), which is one example of the foregoing mode of use, is different, different communication bands are used. However, in the foregoing radio frequency module, a basic circuit configuration other than the filters corresponding to the respective communication bands can be commonly used even in different modes. Whereas, the filters that make up the radio frequency module have different bandpass characteristics for different communication bands, and thus, basically, it is suitable to install separate circuits for respective modes. Therefore, compared with manufacturing of radio frequency modules each having a plurality of different circuits for respective modes, it is advantageous to manufacture radio frequency modules each having, in addition to the common basic circuit configuration described above, a common circuit on which all the filters that can be used in a plurality of modes are installed in the viewpoint of manufacturing efficiency and manufacturing cost.

However, in such common radio frequency module that can be used in a plurality of modes, in the case where the filters corresponding to the respective communication bands are installed separately, the number of filters increases as the number of variations of communication band combination to be used for CA increases, thereby causing the size of the radio frequency module to increase. This becomes an issue.

The present disclosure provides a radio frequency module and a communication device, each of which has a smaller size and can be used in two or more modes where combinations of communication bands for performing CA are different from each other.

A radio frequency module according to one aspect of the present disclosure is a radio frequency module to be used in both a first mode and a second mode, the first mode being a mode where a radio frequency signal of a first frequency band and a radio frequency signal of a second frequency band are simultaneously transmitted, simultaneously received, or simultaneously transmitted and received and a radio frequency signal of a third frequency band and a radio frequency signal of a fourth frequency band are not simultaneously transmitted, simultaneously received, or simultaneously transmitted and received, the second mode being a mode where a radio frequency signal of the first frequency band and a radio frequency signal of the second frequency band are not simultaneously transmitted, simultaneously received, or simultaneously transmitted and received and a radio frequency signal of the third frequency band and a radio frequency signal of the fourth frequency band are simultaneously transmitted, simultaneously received, or simultaneously transmitted and received, the first frequency band including one of the third frequency band and the fourth frequency band, the second frequency band partially overlapping other of the third frequency band and the fourth frequency band in frequency, the radio frequency module including: a common filter whose pass band is the first frequency band; a first individual filter whose pass band is the second frequency band; a second individual filter whose pass band is the other of the third frequency band and the fourth frequency band; and a first switch circuit including a first common terminal, a first selection terminal, a second selection terminal, and a third selection terminal, the first switch circuit being capable of simultaneously connecting, of these four terminals, three terminals including the first common terminal, wherein the first selection terminal is connected to the common filter, the second selection terminal is connected to the first individual filter, the third selection terminal is connected to the second individual filter, when the first mode is performed, the first common terminal and the first selection terminal are connected, the first common terminal and the second selection terminal are connected, and the first common terminal and the third selection terminal are not connected, and when the second mode is performed, the first common terminal and the first selection terminal are connected, the first common terminal and the third selection terminal are connected, and the first common terminal and the second selection terminal are not connected.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 1B is a diagram illustrating frequency allocation of communication bands that can be used by the radio frequency module according to Embodiment 1;

FIG. 5B is a diagram illustrating frequency allocation of communication bands that can be used by the radio frequency module according to Embodiment 2;

FIG. 6B is a diagram illustrating frequency allocation of communication bands that can be used by the radio frequency module according to the modified example of Embodiment 2.

DETAILED DESCRIPTION

Figure 1A:
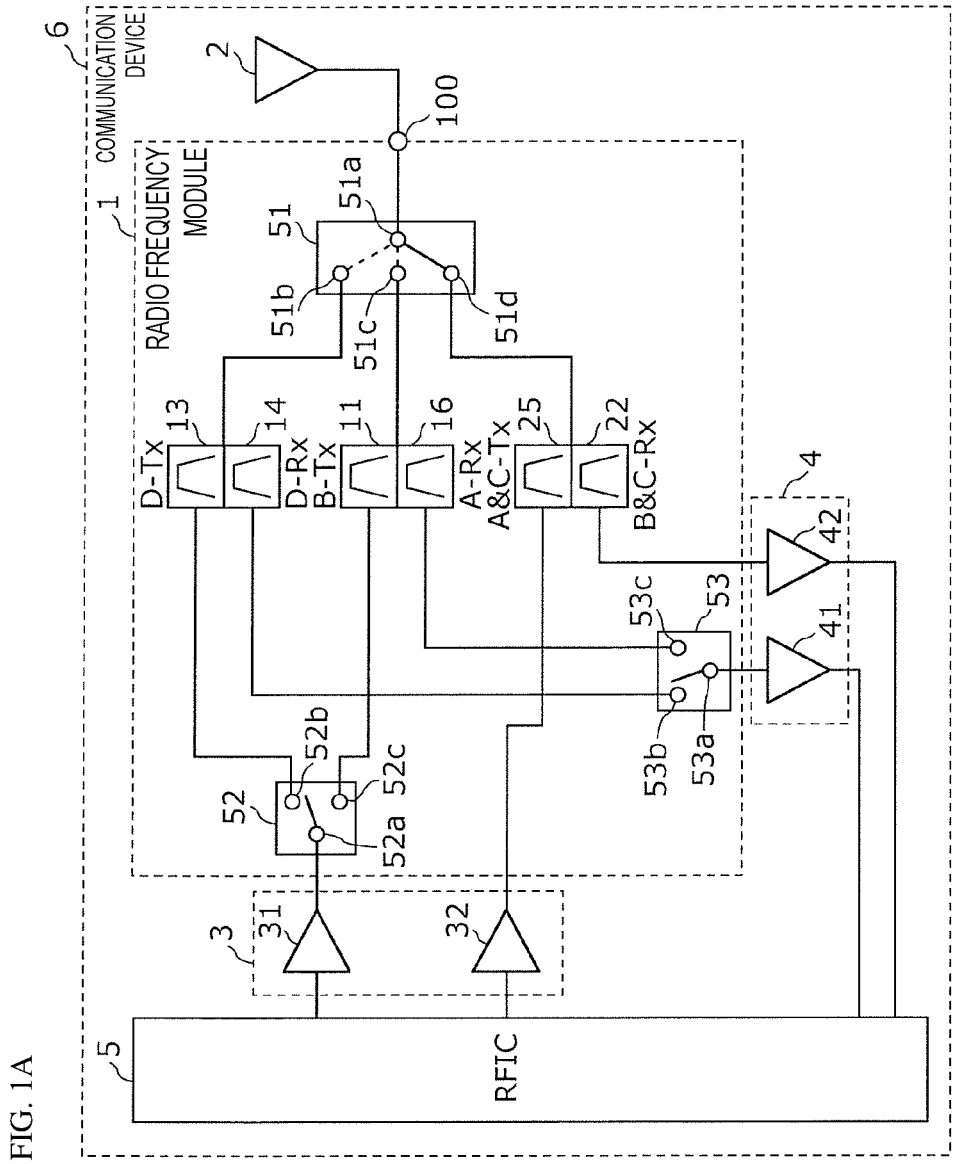
FIG. 1A is a circuit configuration diagram of a communication device according to Embodiment 1.

Hereinafter, embodiments of the present disclosure will be described in detail with reference to the drawings. Note that the embodiments and modified examples, which will be described below, each illustrates a comprehensive or specific example. Numeric values, shapes, materials, constituting elements, arrangements, and connection modes of the constituting elements, and the like illustrated in the following embodiments and modified examples are mere examples, and not intended to limit the present disclosure. Of constituting elements in the following embodiments and modified examples, the constituting elements that are not described in an independent claim will be described as optional constituting elements. Furthermore, dimensions or ratios of dimensions of constituting elements illustrated in the drawings are not necessarily be precise.

Embodiment 1

FIG. 1A is a circuit configuration diagram of a communication device 6 according to Embodiment 1. As illustrated in FIG. 1A, the communication device 6 includes an antenna element 2, a radio frequency module 1, a transmit amplifier circuit 3, a receive amplifier circuit 4, and a RF signal processing circuit (RFIC) 5.

The RFIC 5 is an RF signal processing circuit that performs processing on radio frequency signals to be transmitted from and received by the antenna element 2. Specifically, the RFIC 5 performs signal processing on a radio frequency signal input via a receive path of the radio frequency module 1 using down-converting and the like, and outputs a received signal generated by this signal processing to a baseband signal processing circuit (not illustrated). Furthermore, the RFIC 5 performs signal processing on a transmit signal input from the baseband signal processing circuit using up-converting and the like, and outputs a radio frequency signal generated by this signal processing to a transmit path of the radio frequency module 1.

Furthermore, the RFIC 5 also functions as a control unit that controls connections of switches 52 and 53 included in the radio frequency module 1 based on a communication band (frequency band) to be used. Specifically, the RFIC 5 switches the connections in the switches 52 and 53 included in the radio frequency module 1 using control signals (not illustrated). Alternatively, the controller unit may be provided outside the RFIC 5, or may be provided, for example, inside the radio frequency module 1 or the baseband signal processing circuit.

The transmit amplifier circuit 3 is made up of transmit amplifiers 31 and 32. Of radio frequency transmit signals output from the RFIC 5, the transmit amplifier 31 can amplify radio frequency signals of communication bands B and D and outputs these amplified radio frequency transmit signals to the switch 52 of the radio frequency module 1. Of the radio frequency transmit signals output from the RFIC 5, the transmit amplifier 32 can amplify radio frequency signals of communication bands A and C and outputs these amplified radio frequency transmit signals to a transmit filter 25 of the radio frequency module 1.

The receive amplifier circuit 4 is made up of receive amplifiers 41 and 42. Of radio frequency receive signals output from the radio frequency module 1, the receive amplifier 41 can amplify radio frequency signals of the communication bands A and D and outputs these amplified radio frequency receive signals to the RFIC 5. Of the radio frequency receive signals output from the radio frequency module 1, the receive amplifier 42 can amplify radio frequency signals of the communication bands B and C and outputs these amplified radio frequency receive signals to the RFIC 5.

The antenna element 2 is connected to an antenna common terminal 100 of the radio frequency module 1, emits a radio frequency signal output from the radio frequency module 1, and further receives a radio frequency signal from outside and outputs to the radio frequency module 1.

Note that in the communication device 6 according to the present embodiment, the antenna element 2 is an optional constituting element.

Next, the configuration of the radio frequency module 1 is described in detail.

As illustrated in FIG. 1A, the radio frequency module 1 includes an antenna common terminal 100, transmit filters 11, 13, and 25, receive filters 14, 16, and 22, and switches 51, 52, and 53.

The antenna common terminal 100 is connected to the antenna element 2.

FIG. 1B is a diagram illustrating frequency allocation of communication bands that can be used by the radio frequency module 1 according to Embodiment 1. The radio frequency module 1 according to the present embodiment is capable of simultaneously transmitting (multi-uplink), simultaneously receiving (multi-downlink), or simultaneously transmitting and receiving a radio frequency signal of a communication band A (first communication band) and a radio frequency signal of a communication band B (second communication band). Furthermore, the radio frequency module 1 is capable of simultaneously transmitting, simultaneously receiving, or simultaneously transmitting and receiving a radio frequency signal of a communication band C (third communication band) and a radio frequency signal of a communication band D (fourth communication band). The communication bands A and B are used, for example, in a first area, and the communication bands C and D are used, for example, in a second area.

Note that a first mode is defined as the state where a radio frequency signal of the communication band A (first communication band) and a radio frequency signal of the communication band B (second communication band) are being simultaneously transmitted (multi-uplink), simultaneously received (multi-downlink), or simultaneously transmitted and received, and a radio frequency signal of the communication band C (third communication band) and a radio frequency signal of the communication band D (fourth communication band) are not being simultaneously transmitted, simultaneously received, or simultaneously transmitted and received. Furthermore, a second mode is defined as the state where a radio frequency signal of the communication band A (first communication band) and a radio frequency signal of the communication band B (second communication band) are not being simultaneously transmitted (multi-uplink), simultaneously received (multi-downlink), or simultaneously transmitted and received, and a radio frequency signal of the communication band C (third communication band) and a radio frequency signal of the communication band D (fourth communication band) are being simultaneously transmitted, simultaneously received, or simultaneously transmitted and received.

In the present embodiment, it is assumed that the foregoing first mode is the mode to be used, for example, in the first area, and that the foregoing second mode is the mode to be used, for example, in the second area. However, the foregoing first mode and the foregoing second mode are not limited to be the modes for use in different areas and may be different modes for use in the same area.

The communication band A is, for example, Band 3 (transmit band: 1710-1785 MHz, receive band: 1805-1880 MHz) of Long Term Evolution (LTE). The communication band B is, for example, Band 1 (transmit band: 1920-1980 MHz, receive band: 2110-2170 MHz) of LTE. The communication band C is, for example, Band 4 (transmit band: 1710-1755 MHz, receive band: 2110-2155 MHz) of LTE. The communication band D is, for example, Band 2 (transmit band: 1850-1910 MHz, receive band: 1930-1990 MHz) of LTE.

As illustrated in FIG. 1B, the communication bands A to D each has a transmit band (Tx) and a receive band (Rx). Here, the transmit band (first frequency band, first transmit band) of the communication band A includes the transmit band (third frequency band, second transmit band) of the communication band C, and furthermore the receive band (first receive band) of the communication band B includes the receive band (second receive band) of the communication band C.

Furthermore, the receive band of the communication band A and the transmit band of the communication band D partially overlap in frequency, and the transmit band (second frequency band) of the communication band B and the receive band (fourth frequency band) of the communication band D partially overlap in frequency.

The radio frequency module 1 according to the present embodiment includes the filters that allow radio frequency signals of the communication bands A to D, which are in the frequency relationships described above, to pass and the switches that switch between signal paths for the respective communication bands.

The transmit filter 11 is a first individual transmit filter (first individual filter) whose pass band is the transmit band of the communication band B. The receive filter 16 is a first individual receive filter whose pass band is the receive band of the communication band A.

The transmit filter 13 is a second individual transmit filter whose pass band is the transmit band of the communication band D. The receive filter 14 is a second individual receive filter (second individual filter) whose pass band is the receive band of the communication band D.

The transmit filter 25 is a common transmit filter (common filter) whose pass band is the transmit band (the transmit band including the transmit band of the communication band C) of the communication band A.

The receive filter 22 is a common receive filter whose pass band is the receive band (the receive band including the receive band of the communication band C) of the communication band B.

The switch 51 is a multi-connection type first switch circuit that includes a common terminal 51*a* (first common terminal), a selection terminal 51*b* (third selection terminal), a selection terminal 51*c* (second selection terminal), and a selection terminal 51*d* (first selection terminal) and is capable of simultaneously connecting, of these four terminals, three terminals including the common terminal 51*a*.

The selection terminal 51*b* is connected to an output port of the transmit filter 13 and an input port of the receive filter 14, and the selection terminal 51*c* is connected to an output port of the transmit filter 11 and an input port of the receive filter 16. The selection terminal 51*d* is connected to an output port of the transmit filter 25 and an input port of the receive filter 22.

The switch 52 is a second switch circuit that includes a common terminal 52*a* (second common terminal), a selection terminal 52*b* (fourth selection terminal), and a selection terminal 52*c* (fifth selection terminal) and mutually exclusively switches between a connection between the common terminal 52*a* and the selection terminal 52*b* and a connection between the common terminal 52*a* and the selection terminal 52*c*. The common terminal 52*a* is connected to an output port of the transmit amplifier 31, the selection terminal 52*b* is connected to an input port of the transmit filter 13, and the selection terminal 52*c* is connected to an input port of the transmit filter 11.

The transmit amplifier 31 has amplification characteristics that radio frequency signals of the communication bands B and D can be amplified, and therefore, by installing the switch 52, the single transmit amplifier 31 can be used both when a radio frequency signal of the communication band B is amplified and when a radio frequency signal of the communication band D is amplified. According to this, compared with the case where transmit amplifiers are separately installed for the respective communication bands, the number of transmit amplifiers is reduced, and the cost reduction and the size reduction of the communication device 6 or the radio frequency module 1 including the transmit amplifier 31 are achieved.

The switch 53 is a third switch circuit that includes a common terminal 53*a* (third common terminal), a selection terminal 53*b* (sixth selection terminal), and a selection terminal 53*c* (seventh selection terminal) and mutually exclusively switches between a connection between the common terminal 53*a* and the selection terminal 53*b* and a connection between the common terminal 53*a* and the selection terminal 53*c*. The common terminal 53*a* is connected to an input port of the receive amplifier 41, the selection terminal 53*b* is connected to an output port of the receive filter 14, and the selection terminal 53*c* is connected to an output port of the receive filter 16.

The receive amplifier 41 has amplification characteristics that radio frequency signals of the communication bands A and D can be amplified, and therefore, by installing the switch 53, the single receive amplifier 41 can be used both when a radio frequency signal of the communication band A is amplified and when a radio frequency signal of the communication band D is amplified. According to this, compared with the case where receive amplifiers are separately installed for the respective communication bands, the number of the receive amplifiers is reduced, and the cost reduction and the size reduction of the communication device 6 or the radio frequency module 1 including the receive amplifier 41 are achieved.

The radio frequency module 1 having the foregoing configuration is in one of the following circuit states depending on whether the radio frequency module 1 is used in the first area or the second area.

Figure 2A:
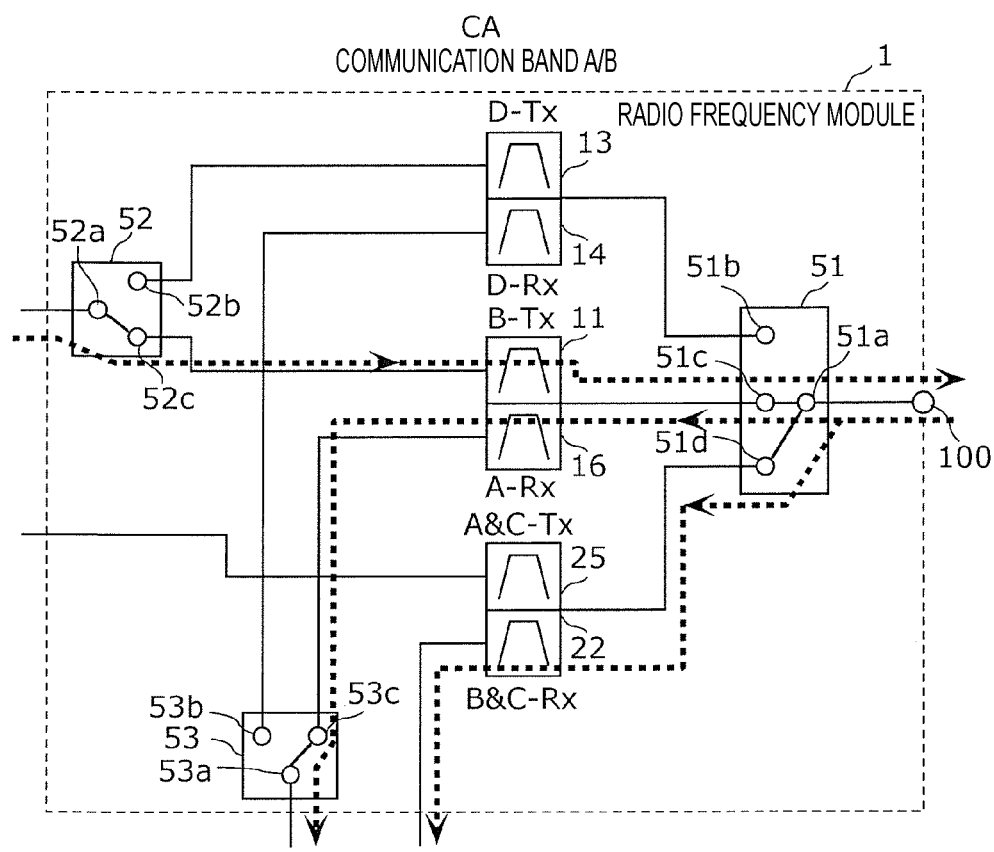
FIG. 2A is a diagram illustrating a circuit state of the radio frequency module according to Embodiment 1 for CA in a first area.

FIG. 2A is a diagram illustrating the circuit state of the radio frequency module 1 according to Embodiment 1 for CA in the first area. Furthermore, FIG. 2B is a diagram illustrating the frequency allocation in the first area for the radio frequency module 1 according to Embodiment 1.

Figure 3A:
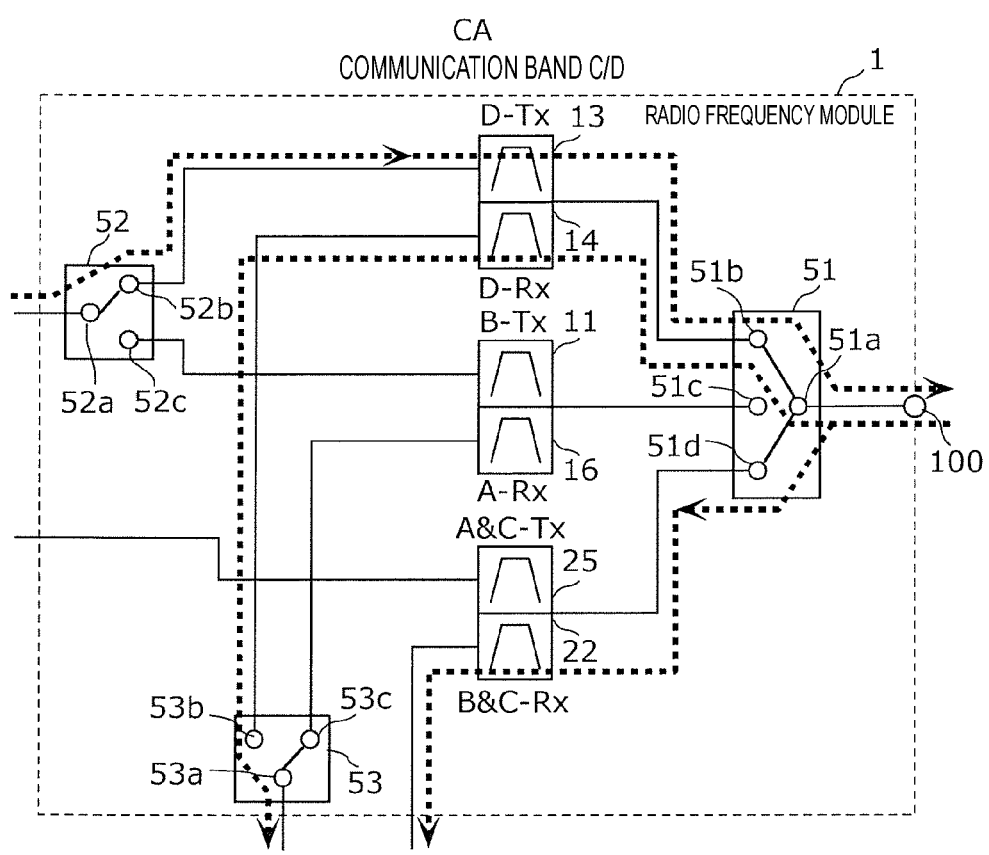
FIG. 3A is a diagram illustrating a circuit state of the radio frequency module according to Embodiment 1 for CA in a second area.
Figure 3B:
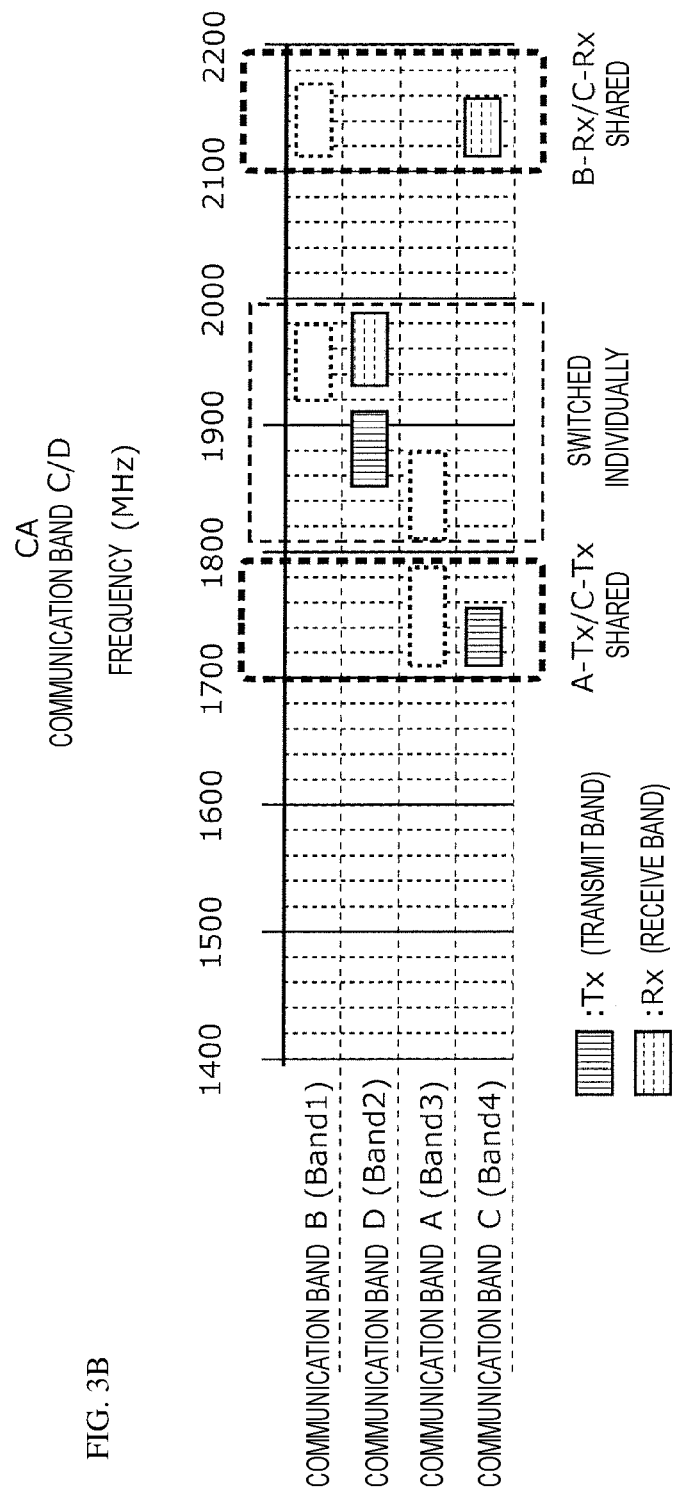
FIG. 3B is a diagram illustrating frequency allocation in the second area for the radio frequency module according to Embodiment 1.

FIG. 3A is a diagram illustrating the circuit state of the radio frequency module 1 according to Embodiment 1 for CA in the second area. Furthermore, FIG. 3B is a diagram illustrating the frequency allocation in the second area for the radio frequency module 1 according to Embodiment 1.

Figure 2B:
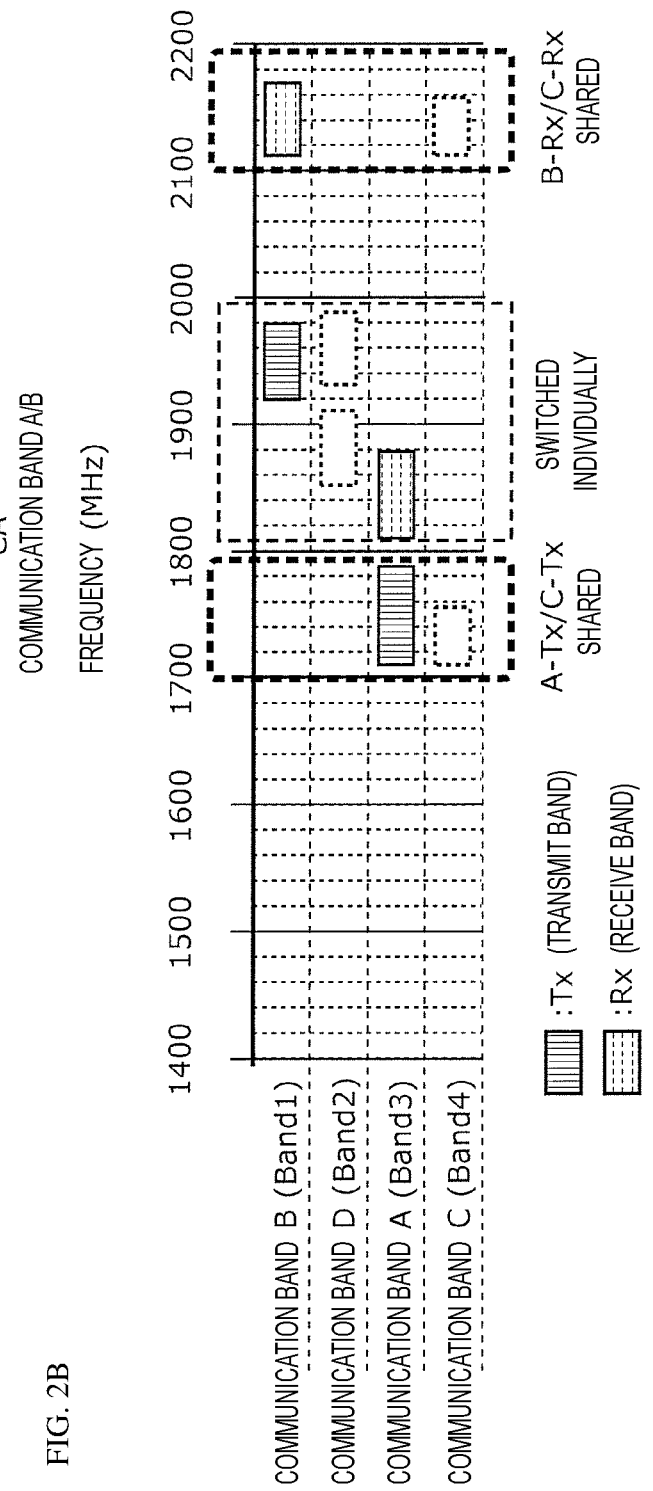
FIG. 2B is a diagram illustrating frequency allocation in the first area for the radio frequency module according to Embodiment 1.

As illustrated in FIG. 2B, in the first area, the communication band A and the communication band B are used, and the communication band C and the communication band D are not used. Furthermore, as illustrated in FIG. 3B, in the second area, the communication band C and the communication band D are used, and the communication band A and the communication band B are not used.

Note that FIG. 2A and FIG. 3A each illustrates an exemplary circuit state for the case of the simultaneous receiving (one uplink two downlink) of two communication bands, which is one of the simultaneous transmitting, the simultaneous receiving, and the simultaneous transmitting and receiving. Note that even in the cases of the simultaneous transmitting and the simultaneous transmitting and receiving of two communication bands, CA can be performed in the first area and in the second area by switching the connection of the switch 51.

As illustrated in FIG. 2A, in the first area, in the case where a radio frequency signal of the communication band A and a radio frequency signal of the communication band B are simultaneously received (one uplink two downlink), the common terminal 51a and the selection terminal 51d are connected, the common terminal 51a and the selection terminal 51c are connected, and the common terminal 51a and the selection terminal 51b are not connected. According to this connection configuration, a radio frequency transmit signal of the communication band B is transmitted from the antenna common terminal 100 via the switch 52, the transmit filter 11, and the switch 51, and simultaneously, a radio frequency receive signal of the communication band A is received by the RFIC 5 via the switch 51, the receive filter 16, and the switch 53. Furthermore, simultaneously, a radio frequency receive signal of the communication band B is received by the RFIC 5 via the switch 51 and the receive filter 22. Note that although it is not illustrated, in the foregoing one uplink two downlink, for the transmitting side, a radio frequency transmit signal of the communication band A may be transmitted from the antenna common terminal 100 via the transmit filter 25 and the switch 51. In the case of two uplink, a radio frequency transmit signal of the communication band B may be transmitted from the antenna common terminal 100 via the switch 52, the transmit filter 11, and the switch 51, and simultaneously, a radio frequency transmit signal of the communication band A may be transmitted from the antenna common terminal 100 via the transmit filter 25 and the switch 51.

Whereas, as illustrated in FIG. 3A, in the second area, in the case where a radio frequency signal of the communication band C and a radio frequency signal of the communication band D are simultaneously received (one uplink two downlink), the common terminal 51a and the selection terminal 51d are connected, the common terminal 51a and the selection terminal 51b are connected, and the common terminal 51a and the selection terminal 51c are not connected. According to this connection configuration, a radio frequency transmit signal of the communication band D is transmitted from the antenna common terminal 100 via the switch 52, the transmit filter 13, and the switch 51, and simultaneously, a radio frequency receive signal of the communication band D is received by the RFIC 5 via the switch 51, the receive filter 14, and the switch 53. Furthermore, simultaneously, a radio frequency receive signal of the communication band C is received by the RFIC 5 via the switch 51 and the receive filter 22. Note that although it is not illustrated, in the foregoing one uplink two downlink, for the transmitting side, a radio frequency transmit signal of the communication band C may be transmitted from the antenna common terminal 100 via the transmit filter 25 and the switch 51. Furthermore, in the case of two uplink, a radio frequency transmit signal of the communication band D may be transmitted from the antenna common terminal 100 via the switch 52, the transmit filter 13, and the switch 51, and simultaneously, a radio frequency transmit signal of the communication band C may be transmitted from the antenna common terminal 100 via the transmit filter 25 and the switch 51.

Next, before describing advantageous effects of the radio frequency module 1 according to the present embodiment, there is illustrated a configuration of a prior art radio frequency module 500 in the foregoing frequency relationship of the communication bands A to D.

Figure 4A:
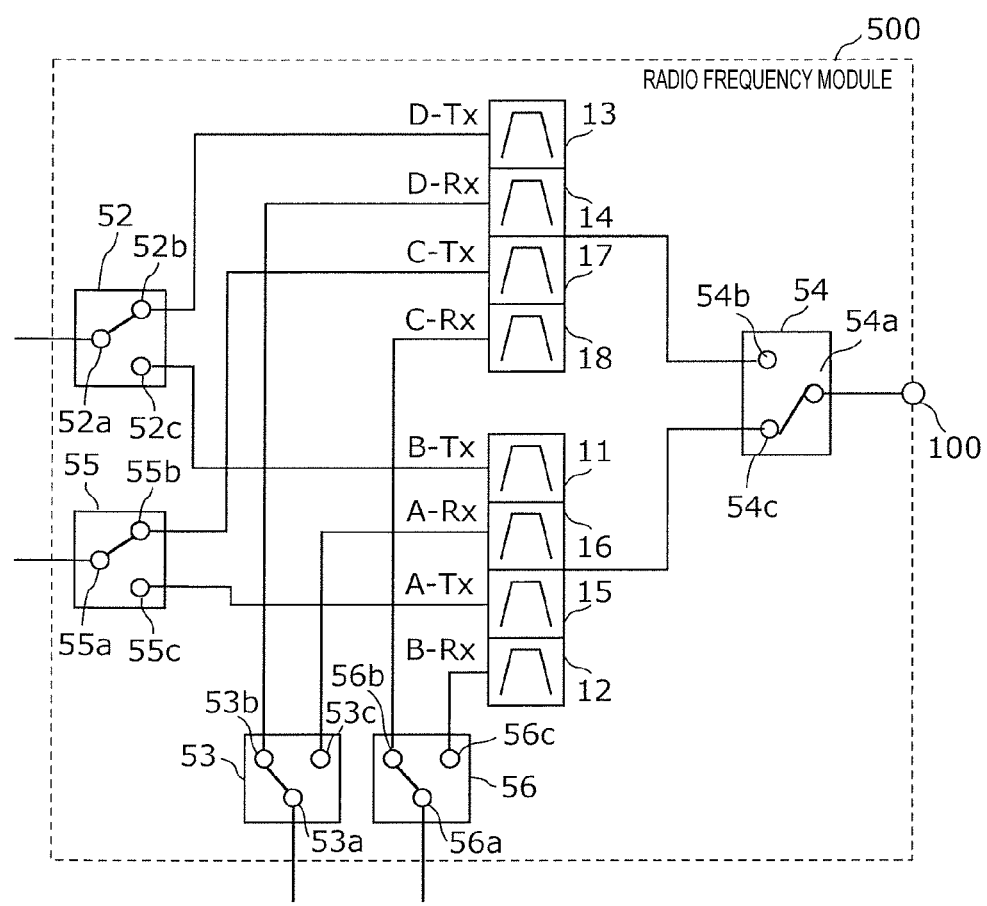
FIG. 4A is a circuit configuration diagram of a radio frequency module according to a comparative example.
Figure 4B:
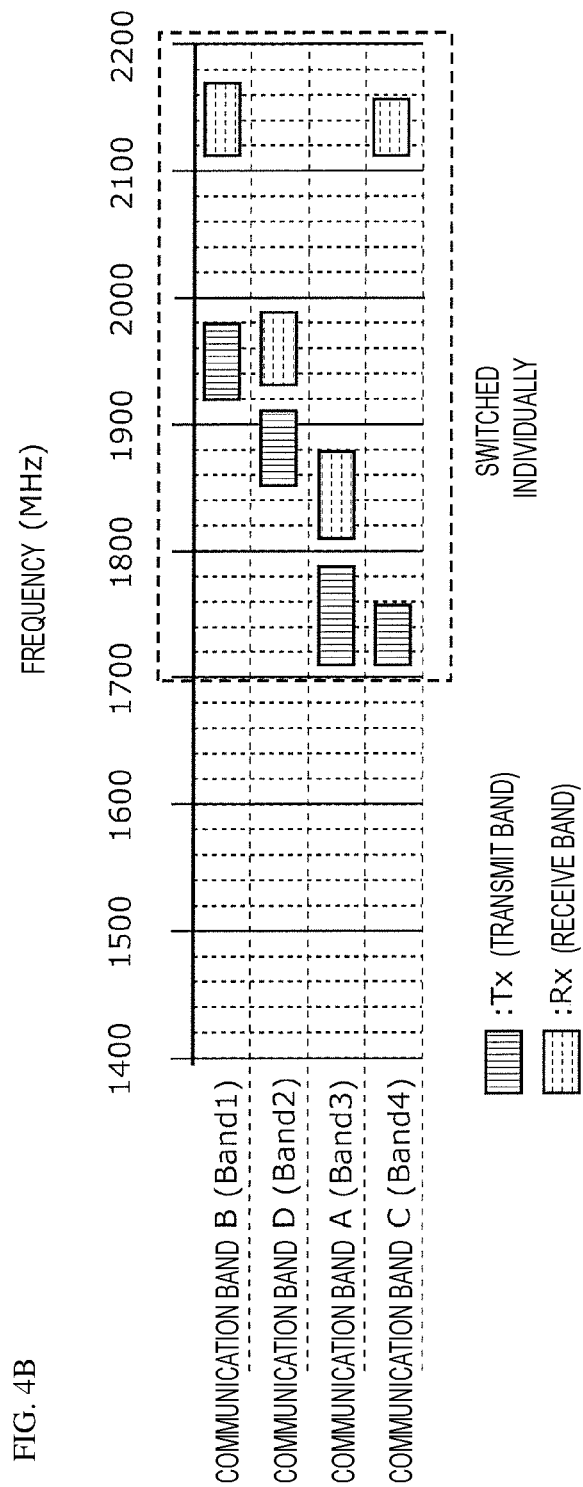
FIG. 4B is a diagram illustrating frequency allocation of communication bands that can be used by the radio frequency module according to the comparative example.

FIG. 4A is a circuit configuration diagram of the radio frequency module 500 according to a comparative example. Furthermore, FIG. 4B is a diagram illustrating the frequency allocation of the communication bands that can be used by the radio frequency module 500 according to the comparative example. As illustrated in FIG. 4A, the radio frequency module 500 according to the comparative example includes an antenna common terminal 100, transmit filters 11, 13, 15, and 17, receive filters 12, 14, 16, and 18, and switches 52, 53, 54, 55, and 56. The radio frequency module 500 according to the comparative example is different from the radio frequency module 1 according to Embodiment 1 in that individual filters corresponding to transmit bands and receive bands of four communication bands are installed and switches that switch between connections to these individual filters have different configurations. Hereinafter, the radio frequency module 500 according to the comparative example is described with the emphasis on points different from the radio frequency module 1 according to Embodiment 1.

The frequency relationship among the four communication bands illustrated in FIG. 4B is similar to the frequency relationship among the four communication bands illustrated in FIG. 1B. However, in the radio frequency module 500 according to the present comparative example, the filter to be shared by two communication bands is not installed.

The transmit filter 15 is an individual transmit filter whose pass band is the transmit band of the communication band A. The transmit filter 17 is an individual transmit filter whose pass band is the transmit band of the communication band C. The receive filter 12 is an individual receive filter whose pass band is the receive band of the communication band B. The receive filter 18 is an individual receive filter whose pass band is the receive band of the communication band C.

The transmit filters 13 and 17 and the receive filters 14 and 18 make up a second quadplexer for transmitting and receiving radio frequency signals of the communication bands C and D, which are used in the second area. Furthermore, the transmit filters 11 and 15 and the receive filters 12 and 16 make up a first quadplexer for transmitting and receiving radio frequency signals of the communication bands A and B, which are used in the first area.

The switch 54 is a multi-connection type switch circuit that includes a common terminal 54a and selection terminals 54b and 54c and is capable of simultaneously making a connection between the common terminal 54a and the selection terminal 54b and a connection between the common terminal 54a and the selection terminal 54c. The selection terminal 54b is connected to the foregoing second quadplexer, and the selection terminal 54c is connected to the foregoing first quadplexer.

The switch 55 is a switch circuit that includes a common terminal 55a and selection terminals 55b and 55c and mutually exclusively switches between a connection between the common terminal 55a and the selection terminal 55b and a connection between the common terminal 55a and the selection terminal 55c. The common terminal 55a is connected to an output port of the transmit amplifier 32, the selection terminal 55b is connected to an input port of the transmit filter 17, and the selection terminal 55c is connected to an input port of the transmit filter 15.

The switch 56 is a switch circuit that includes a common terminal 56a and selection terminals 56b and 56c and mutually exclusively switches between a connection between the common terminal 56a and the selection terminal 56b and a connection between the common terminal 56a and the selection terminal 56c. The common terminal 56a is connected to an input port of the receive amplifier 42, the selection terminal 56b is connected to an output port of the receive filter 18, and the selection terminal 56c is connected to an output port of the receive filter 12.

According to the foregoing configuration, the radio frequency module 500 according to the comparative example is capable of simultaneously transmitting (multi-uplink), simultaneously receiving (multi-downlink), or simultaneously transmitting and receiving a radio frequency signal of the communication band A and a radio frequency signal of the communication band B. Furthermore, the radio frequency module 500 is capable of simultaneously transmitting, simultaneously receiving, or simultaneously transmitting and receiving a radio frequency signal of the communication band C and a radio frequency signal of the communication band D. The communication bands A and B are used in the first area, and the communication bands C and D are used, for example, in the second area.

However, in the radio frequency module 500 according to the comparative example, the filter is installed for each of the transmit bands and receive bands of the communication bands A to D. This necessitates eight filters and five switches in total, thereby causing an increase in the size of the radio frequency module 500. Furthermore, if an individual filter is installed for each of the transmit bands and the receive bands of the communication bands, when CA is performed by combining three or more of communication bands available for CA, the number of the filters increases as the number of variations of the combination increases, thereby causing the size of the radio frequency module to increase. This becomes an issue.

On the other hand, because the communication bands are in the frequency relationship illustrated in FIG. 1B, the radio frequency module 1 according to the present embodiment enables to standardize a transmit filter for use in the first area and a transmit filter for use in the second area into the single transmit filter 25 (common transmit filter) and further standardize a receive filter for use in the first area and a receive filter for use in the second area into the single receive filter 22 (common receive filter). According to this, the total number of the filters whose pass bands are the respective ones of the transmit bands and the receive bands of the communication bands is six, thereby achieving the reduction in the number of components and the reduction in the size of the radio frequency module 1.

Furthermore, instead of manufacturing radio frequency modules having different configurations for different areas of use, it becomes possible to manufacture the radio frequency modules 1 of a single type that can be used in both areas. This improves efficiency in manufacturing and reduces the manufacturing cost.

Furthermore, when switching between CA of the communication bands A and B in the first area and CA of the communication bands C and D in the second area, an exclusive control is performed between the connection between the common terminal 51a and the selection terminal 51c and the connection between the common terminal 51a and the selection terminal 51b in the switch 51. This ensures the isolation between a set of the transmit filter 11 (first individual transmit filter) and the receive filter 16 (first individual receive filter) and a set of the transmit filter 13 (second individual transmit filter) and the receive filter 14 (second individual receive filter).

Furthermore, in the radio frequency module 1 according to the present embodiment, the transmit filter 25 for the transmit band of the communication band A (including the transmit band of the communication band C) and the receive filter 22 for the receive band of the communication band B (including the receive band of the communication band C) are connected in common to the selection terminal 51d of the switch 51. Furthermore, the transmit filter 11 for the transmit band of the communication band B and the receive filter 16 for the receive band of the communication band A are connected in common to the selection terminal 51c of the switch 51. In other words, it is not limited to the case where a transmit filter and a receive filter of the same communication band are connected in common. Alternatively, a transmit filter and a receive filter of different communication bands may be connected in common depending on the frequency inclusion relationship of the communication bands. This improves the flexibility in designing the filter arrangement.

Note that the frequency relationship among the communication bands A to D, which can be used by the radio frequency modules according to the present disclosure, is not limited to the frequency relationship illustrated in FIG. 1B and only needs to be the following frequency relationship. That is to say, it is only suitable to have the relationship such that the first transmit band, which is the transmit band of the communication band A, includes the second transmit band, which is one of the transmit band of the communication band C and the transmit band of the communication band D, and further the first receive band, which is one of the receive band of the communication band A and the receive band of the communication band B, includes the second receive band, which is one of the receive band of the communication band C and the receive band of the communication band D, or the second receive band includes the first receive band. At this time, a pass band of the common transmit filter is the first transmit band, and a pass band of the common receive filter is the first receive band or the second receive band, whichever has the wider bandwidth. Furthermore, a pass band of the first individual transmit filter is the transmit band of the communication band B, and a pass band of the first individual receive filter is the other of the receive band of the communication band A and the receive band of the communication band B. Furthermore, a pass band of the second individual transmit filter is the other of the transmit band of the communication band C and the transmit band of the communication band D, and a pass band of the second individual receive filter is the other of the receive band of the communication band C and the receive band of the communication band D. Furthermore, at least one of (1) the transmit band of the communication band B and (2) the foregoing other of the receive band of the communication band A and the receive band of the communication band B partially overlaps in frequency at least one of the (3) the foregoing other of the transmit band of the communication band C and the transmit band of the communication band D and (4) the foregoing other of the receive band of the communication band C and the receive band of the communication band D.

Furthermore, the radio frequency module 1 according to the present embodiment may include at least one of the transmit amplifier circuit 3 and the receive amplifier circuit 4.

Furthermore, at least one of the switches 52 and 53 may be omitted. In the case where the switch 52 is not included, the first transmit amplifier that can amplify a radio frequency signal of the communication band D may be connected to the transmit filter 13, and the second transmit amplifier that can amplify a radio frequency signal of the communication band B may be connected to the transmit filter 11. Furthermore, in the case where the switch 53 is not included, the first receive amplifier that can amplify a radio frequency signal of the communication band D may be connected to the receive filter 14, and the second receive amplifier that can amplify a radio frequency signal of the communication band A may be connected to the transmit filter 16.

Furthermore, the foregoing embodiment has the configuration in which each of the communication bands A, B, C, and D has both the transmit band and the receive band. However, radio frequency modules according to the present disclosure are not limited thereto. The communication band may be the one having separate transmit and receive bands such as in the foregoing communication bands A, B, C, and D, the one in which a single band is used for transmitting and receiving by switching therebetween, or the one having only a transmit band or a receive band.

From the viewpoint described above, a radio frequency module according to the present disclosure is used in both a first mode and a second mode, the first mode being a mode where a radio frequency signal of a first frequency band and a radio frequency signal of a second frequency band are simultaneously transmitted, simultaneously received, or simultaneously transmitted and received and a radio frequency signal of a third frequency band and a radio frequency signal of a fourth frequency band are not simultaneously transmitted, simultaneously received, or simultaneously transmitted and received, the second mode being a mode where a radio frequency signal of the first frequency band and a radio frequency signal of the second frequency band are not simultaneously transmitted, simultaneously received, or simultaneously transmitted and received and a radio frequency signal of the third frequency band and a radio frequency signal of the fourth frequency band are simultaneously transmitted, simultaneously received, or simultaneously transmitted and received, the first frequency band including one of the third frequency band and the fourth frequency band, the second frequency band partially overlapping the other of the third frequency band and the fourth frequency band in frequency. Here, the radio frequency module according to the present disclosure includes a common filter whose pass band is the first frequency band, a first individual filter whose pass band is the second frequency band, a second individual filter whose pass band is the other of the third frequency band and the fourth frequency band, and a first switch circuit including a first common terminal, a first selection terminal, a second selection terminal, and a third selection terminal, the first switch circuit being capable of simultaneously connecting, of these four terminals, three terminals including the first common terminal. The radio frequency module may be characterized in that the first selection terminal is connected to the common filter, the second selection terminal is connected to the first individual filter, the third selection terminal is connected to the second individual filter, when the first mode is performed, the first common terminal is connected to the first selection terminal, the first common terminal is connected to the second selection terminal, and the first common terminal is not connected to the third selection terminal, and when the second mode is performed, the first common terminal is connected to the first selection terminal, the first common terminal is connected to the third selection terminal, and the first common terminal is not connected to the second selection terminal.

For example, the foregoing configuration may be applied to a case where the communication bands A to D include only transmit bands and are in the following frequency relationship.

Specifically, it is the case where the radio frequency module is used both in the first area where a first mode is performed while a second mode is not performed and in the second area where the foregoing first mode is not performed while the foregoing second mode is performed, the first mode being a mode where a radio frequency signal of a first frequency band (transmit band of the communication band A: hereinafter, referred to as "A-Tx") and a radio frequency signal of a second frequency band (B-Tx) are simultaneously transmitted, the second mode being a mode where a radio frequency signal of a third frequency band (C-Tx) and a radio frequency signal of a fourth frequency band (D-Tx) are simultaneously transmitted, the first frequency band (A-Tx) including the third frequency band (C-Tx), the second frequency band (B-Tx) partially overlapping the fourth frequency band (D-Tx) in frequency.

Here, a radio frequency module according to the present disclosure includes a common filter (transmit filter 25) whose pass band is the first frequency band (A-Tx), a first individual filter (transmit filter 11) whose pass band is the second frequency band (B-Tx), a second individual filter (transmit filter 13) whose pass band is the fourth frequency band (D-Tx), and a first switch circuit (switch 51) having a first common terminal (common terminal 51a), a first selection terminal (selection terminal 51d), a second selection terminal (selection terminal 51c), and a third selection terminal (selection terminal 51b), the first switch circuit being capable of simultaneously connecting, of these four terminals, three terminals including the first common terminal. The first selection terminal is connected to the common filter, the second selection terminal is connected to the first individual filter, and the third selection terminal is connected to the second individual filter. In the first area, when the first mode is performed, the first common terminal and the first selection terminal are connected, the first common terminal and the second selection terminal are connected, and the first common terminal and the third selection terminal are not connected. In the second area, when the second mode is performed, the first common terminal and the first selection terminal are connected, the first common terminal and the third selection terminal are connected, and the first common terminal and the second selection terminal are not connected.

The circuit configuration that corresponds to this may be, for example, a configuration obtained by deleting the receive filters 14, 16, and 22 and the switch 53 from the radio frequency module 1 illustrated in FIG. 1A.

According to the foregoing radio frequency module according to the present disclosure, it becomes possible to standardize a transmit filter for use in the first area and a transmit filter for use in the second area into a single transmit filter (common filter) because the frequency relationship is such that the first frequency band (A-Tx) includes the third frequency band (C-Tx) and the second frequency band (B-Tx) partially overlaps the fourth frequency band (D-Tx) in frequency. According to this, the total number of the filters whose pass bands are the respective transmit bands of the communication bands is three, thereby achieving the reduction in the number of components and the reduction in the size of the radio frequency module.

Furthermore, instead of manufacturing radio frequency modules having different configurations for different areas of use, it becomes possible to manufacture the radio frequency modules of a single type that can be used in both areas. This improves efficiency in manufacturing and reduces the manufacturing cost.

Note that the foregoing radio frequency module according to the present disclosure is similarly applicable to the case where the communication bands A to D include only receive bands.

The circuit configuration that corresponds to this may be, for example, a configuration obtained by deleting the transmit filters 11, 13, and 25 and the switch 52 from the radio frequency module 1 illustrated in FIG. 1A. According to this, the total number of the filters whose pass bands are the respective receive bands of the communication bands is three, thereby achieving the reduction in the number of components and the reduction in the size of the radio frequency module.

Furthermore, instead of manufacturing radio frequency modules having different configurations for different areas of use, it becomes possible to manufacture the radio frequency modules of a single type that can be used in both areas. This improves efficiency in manufacturing and reduces the manufacturing cost.

Embodiment 2

In Embodiment 1, there is illustrated the radio frequency module 1 in which the common transmit filter based on the inclusion relationship between the transmit band of the communication band for use in the first area and the transmit band of the communication band for use in the second area and the common receive filter based on the inclusion relationship between the receive band of the communication band for use in the first area and the receive band of the communication band for use in the second area are installed. On the other hand, in the present embodiment, there are illustrated radio frequency modules 1A and 1B, in each of which only one of the foregoing common transmit filter and the foregoing common receive filter is installed.

Figure 5A:
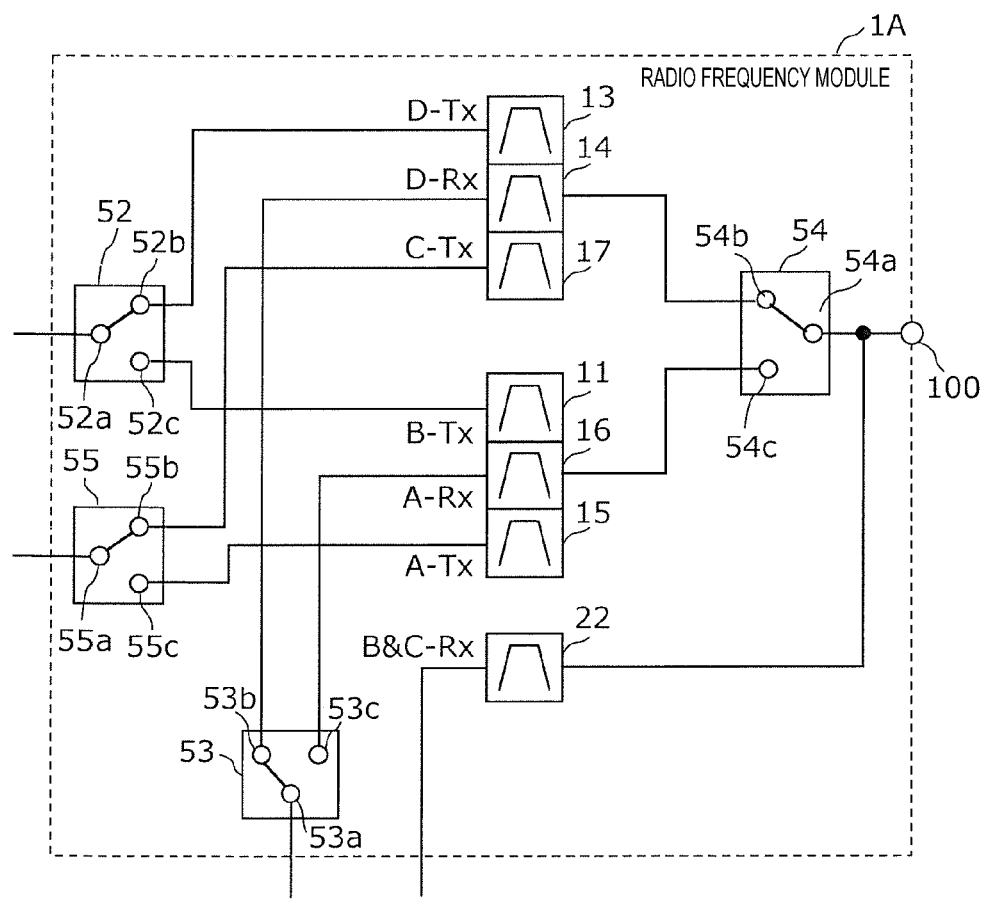
FIG. 5A is a circuit configuration diagram of a radio frequency module according to Embodiment 2.

FIG. 5A is a circuit configuration diagram of a radio frequency module 1A according to Embodiment 2. Furthermore, FIG. 5B is a diagram illustrating frequency allocation of communication bands that can be used by the radio frequency module 1A according to Embodiment 2. As illustrated in FIG. 5A, the radio frequency module 1A according to the present embodiment includes an antenna common terminal 100, transmit filters 11, 13, 15, and 17, receive filters 14, 16, and 22, and switches 52, 53, 54, and 55. The radio frequency module 1A according to the present embodiment is different from the radio frequency module 1 according to Embodiment 1 in that four individual transmit filters corresponding to transmit bands of four communication bands are installed, a common transmit filter is not installed, and switches that switch between connections to these individual filters have different configurations. Hereinafter, the radio frequency module 1A according to the present embodiment is described with the emphasis on points different from the radio frequency module 1 according to Embodiment 1.

The frequency relationship among the four communication bands illustrated in FIG. 5B is similar to the frequency relationship among the four communication bands illustrated in FIG. 1B. However, in the radio frequency module 1A according to the present embodiment, the transmit filter to be shared by two communication bands is not installed.

The transmit filter 15 is an individual transmit filter whose pass band is the transmit band of the communication band A. The transmit filter 17 is an individual transmit filter whose pass band is the transmit band of the communication band C.

The transmit filters 13 and 17 and the receive filter 14 make up a second triplexer for transmitting and receiving radio frequency signals of the communication bands C and D, which are used in the second area. Furthermore, the transmit filters 11 and 15 and the receive filter 16 make up a first triplexer for transmitting and receiving radio frequency signals of the communication bands A and B, which are used in the first area.

The switch 54 is a multi-connection type switch circuit that includes a common terminal 54a and selection terminals 54b and 54c and is capable of simultaneously making a connection between the common terminal 54a and the selection terminal 54b and a connection between the common terminal 54a and the selection terminal 54c. The selection terminal 54b is connected to the foregoing second triplexer, and the selection terminal 54c is connected to the foregoing first triplexer.

The switch 55 is a switch circuit that includes a common terminal 55a and selection terminals 55b and 55c and mutually exclusively switches between a connection between the common terminal 55a and the selection terminal 55b and a connection between the common terminal 55a and the selection terminal 55c. The common terminal 55a is connected to an output port of the transmit amplifier 32, the selection terminal 55b is connected to an input port of the transmit filter 17, and the selection terminal 55c is connected to an input port of the transmit filter 15.

Furthermore, an input port of the receive filter 22 is connected to the antenna common terminal 100, and an output port thereof is connected to the receive amplifier 42. Alternatively, the switch 51 according to Embodiment 1 may be installed instead of the switch 54, the input port of the receive filter 22 may be connected to the selection terminal 51*d* of the switch 51, the foregoing second triplexer may be connected to the selection terminal 51*b*, and the foregoing first triplexer may be connected to the selection terminal 51*c*.

Because the communication bands are in the frequency relationship illustrated in FIG. 5B, the radio frequency module 1A according to the present embodiment enables to standardize a receive filter for use in the first area and a receive filter for use in the second area into the single receive filter 22 (common receive filter). According to this, the total number of the filters whose pass bands are the respective ones of the transmit bands and the receive bands of the communication bands is seven, thereby achieving the reduction in the number of components and the reduction in the size of the radio frequency module 1A.

Furthermore, instead of manufacturing radio frequency modules having different configurations for different areas of use, it becomes possible to manufacture the radio frequency modules 1A of a single type that can be used in both areas. This improves efficiency in manufacturing and reduces the manufacturing cost.

Furthermore, when switching between CA of the communication bands A and B in the first area and CA of the communication bands C and D in the second area, the exclusive control is performed between the connection between the common terminal 54*a* and the selection terminal 54*c* and the connection between the common terminal 54*a* and the selection terminal 54*b* in the switch 54. This enables to ensure the isolation between the foregoing first triplexer and the foregoing second triplexer.

Figure 6A:
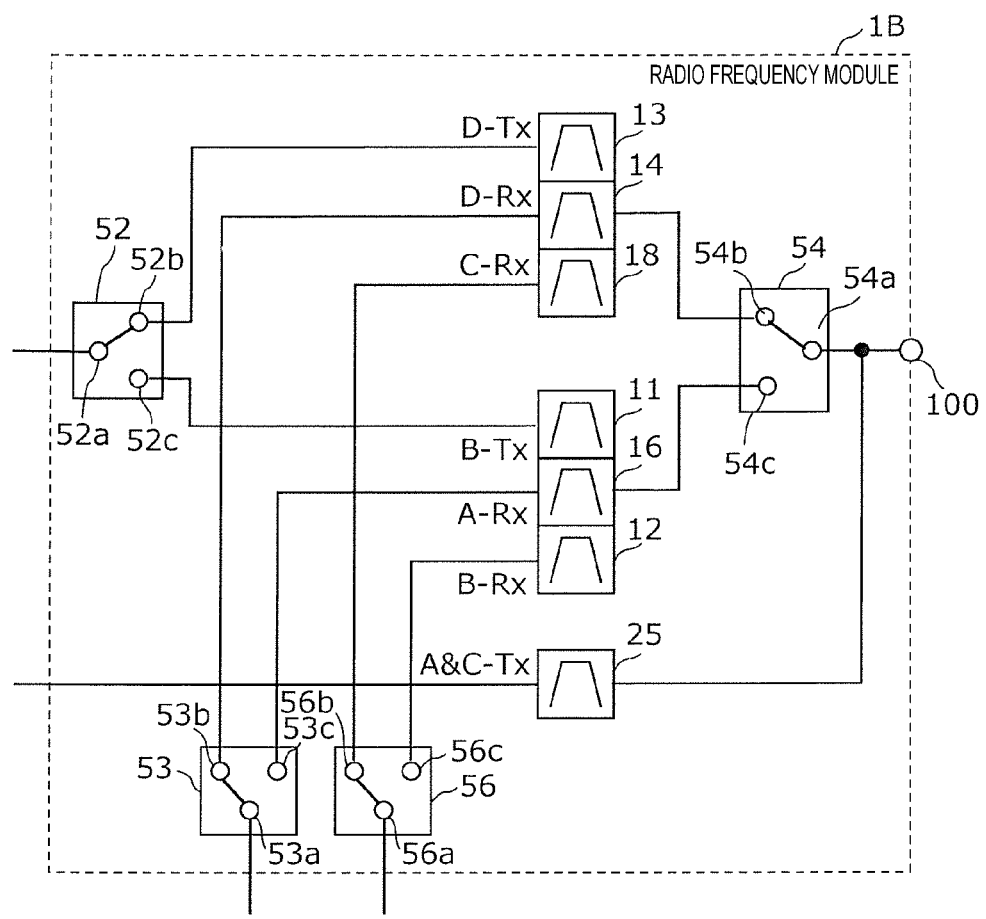
FIG. 6A is a circuit configuration diagram of a radio frequency module according to a modified example of Embodiment 2.

FIG. 6A is a circuit configuration diagram of a radio frequency module 1B according to a modified example of Embodiment 2. Furthermore, FIG. 6B is a diagram illustrating frequency allocation of communication bands that can be used by the radio frequency module 1B according to the modified example of Embodiment 2. As illustrated in FIG. 6A, the radio frequency module 1B according to the present modified example includes an antenna common terminal 100, transmit filters 11, 13, and 25, receive filters 12, 14, 16, and 18, and switches 52, 53, 54, and 56. The radio frequency module 1B according to the present modified example is different from the radio frequency module 1 according to Embodiment 1 in that four individual receive filters corresponding to receive bands of four communication bands are installed, a common receive filter is not installed, and switches that switch between connections to these individual filters have different configurations. Hereinafter, the radio frequency module 1B according to the present modified example is described with the emphasis on points different from the radio frequency module 1 according to Embodiment 1.

The frequency relationship among the four communication bands illustrated in FIG. 6B is similar to the frequency relationship among the four communication bands illustrated in FIG. 1B. However, in the radio frequency module 1B according to the present modified example, the receive filter to be shared by two communication bands is not installed.

The receive filter 12 is an individual receive filter whose pass band is the receive band of the communication band B. The receive filter 18 is an individual receive filter whose pass band is the receive band of the communication band C.

The transmit filter 13 and the receive filters 14 and 18 make up a fourth triplexer for transmitting and receiving radio frequency signals of the communication bands C and D, which are used in the second area. Furthermore, the transmit filter 11 and the receive filters 12 and 16 make up a third triplexer for transmitting and receiving radio frequency signals of the communication bands A and B, which are used in the first area.

The switch 54 is a multi-connection type switch circuit that includes a common terminal 54*a* and selection terminals 54*b* and 54*c* and is capable of simultaneously making a connection between the common terminal 54*a* and the selection terminal 54*b* and a connection between the common terminal 54*a* and the selection terminal 54*c*. The selection terminal 54*b* is connected to the foregoing fourth triplexer, and the selection terminal 54*c* is connected to the foregoing third triplexer.

The switch 56 is a switch circuit that includes a common terminal 56*a* and selection terminals 56*b* and 56*c* and mutually exclusively switches between a connection between the common terminal 56*a* and the selection terminal 56*b* and a connection between the common terminal 56*a* and the selection terminal 56*c*. The common terminal 56*a* is connected to an input port of the receive amplifier 42, the selection terminal 56*b* is connected to an output port of the receive filter 18, and the selection terminal 56*c* is connected to an output port of the receive filter 12.

Furthermore, an output port of the transmit filter 25 is connected to the antenna common terminal 100, and an input port thereof is connected to the transmit amplifier 32. Alternatively, the switch 51 according to Embodiment 1 may be installed instead of the switch 54, the output port of the transmit filter 25 may be connected to the selection terminal 51*d* of the switch 51, the foregoing fourth triplexer may be connected to the selection terminal 51*b*, and the foregoing third triplexer may be connected to the selection terminal 51*c*.

Because the communication bands are in the frequency relationship illustrated in FIG. 6B, the radio frequency module 1B according to the present modified example enables to standardize a transmit filter for use in the first area and a transmit filter for use in the second area into the single transmit filter 25 (common transmit filter). According to this, the total number of the filters whose pass bands are the respective ones of the transmit bands and the receive bands of the communication bands is seven, thereby achieving the reduction in the number of components and the reduction in the size of the radio frequency module 1B.

Furthermore, instead of manufacturing radio frequency modules having different configurations for different areas of use, it becomes possible to manufacture the radio frequency modules 1B of a single type that can be used in both areas. This improves efficiency in manufacturing and reduces the manufacturing cost.

Furthermore, when switching between CA of the communication bands A and B in the first area and CA of the communication bands C and D in the second area, the exclusive control is performed between the connection between the common terminal 54*a* and the selection terminal 54*c* and the connection between the common terminal 54*a* and the selection terminal 54*b* in the switch 54. This enables to ensure the isolation between the foregoing third triplexer and the foregoing fourth triplexer.

Other Embodiments

The radio frequency module and the communication device according to the present disclosure are described using the embodiments and the modified example. However, the present disclosure is not limited to the foregoing embodiments and modified example. Other embodiments realized by combining arbitrary constituting elements of the foregoing embodiment and the modified examples thereof, modified examples obtained by applying various modifications apparent to those skilled in the art to the foregoing embodiments without necessarily departing the scope of the present disclosure, and various devices including radio frequency modules and communication devices may also be included in the present disclosure.

In the foregoing embodiments and modified example, for example, the communication band A is Band 3 of LTE, the communication band B is Band 1 of LTE, the communication band C is Band 4 of LTE, and the communication band D is Band 2 of LTE. Alternatively, as the combination of the communication bands A to D, the following combination may be used.

Specifically, for example, in the embodiments and the modified example, the communication band A may be Band 3 of LTE, the communication band B may be Band 1 of LTE, the communication band C may be Band 66 (Transmit band: 1710-1780 MHz, Receive band: 2110-2200 MHz) of LTE, and the communication band D may be Band 25 (Transmit band: 1850-1915 MHz, Receive band: 1930-1995 MHz) of LTE. In this case, the communication bands A to D each has a transmit band (Tx) and a receive band (Rx). Here, the transmit band (first frequency band, first transmit band) of the communication band A includes the transmit band (third frequency band, second transmit band) of the communication band C. Furthermore, the receive band (second receive band) of the communication band C includes the receive band (first receive band) of the communication band B. In other words, compared with the frequency allocations of the communication bands illustrated in FIG. 1B, FIG. 5B, and FIG. 6B, the inclusion relationship between the frequency band of the communication band B and the frequency band of the communication band C is reversed.

As illustrated in FIG. 1A, for example, this enables to standardize a transmit filter for use in the first area and a transmit filter for use in the second area into the single transmit filter 25 (common transmit filter) and further standardize a receive filter for use in the first area and a receive filter for use in the second area into the single receive filter 22 (common receive filter). According to this, the total number of the filters whose pass bands are the respective ones of the transmit bands and the receive bands of the communication bands is six, thereby achieving the reduction in the number of components and the reduction in the size of the radio frequency module 1.

Furthermore, for example, as illustrated in FIG. 5A, it becomes possible to standardize a receive filter for use in the first area and a receive filter for use in the second area into the single receive filter 22 (common receive filter). According to this, the total number of the filters whose pass bands are the respective ones of the transmit bands and the receive bands of the communication bands is seven, thereby achieving the reduction in the number of components and the reduction in the size of the radio frequency module 1A.

Furthermore, for example, as illustrated in FIG. 6A, it becomes possible to standardize a transmit filter for use in the first area and a transmit filter for use in the second area into the single transmit filter 25 (common transmit filter). According to this, the total number of the filters whose pass bands are the respective ones of the transmit bands and the receive bands of the communication bands is seven, thereby achieving the reduction in the number of components and the reduction in the size of the radio frequency module 1B.

Furthermore, for example, in the radio frequency modules and the communication device according to the embodiments and the modified example, a matching element such as an inductor, a capacitor, or the like, or a switch circuit may be connected between constituting elements. Note that the inductor may include a wiring inductor using a wiring line connecting constituting elements.

The present disclosure can be widely used in communication equipment such as cellular phones and the like as a radio frequency module and a communication device, each of which has a smaller size and can be used in two or more areas where communication bands of CA are different from each other.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio frequency module configured for operation in both a first mode and a second mode,
   wherein in the first mode, a radio frequency signal of a first frequency band and a radio frequency signal of a second frequency band are simultaneously transmitted, are simultaneously received, or are simultaneously transmitted and received, and a radio frequency signal of a third frequency band and a radio frequency signal of a fourth frequency band are not simultaneously transmitted, are not simultaneously received, or are not simultaneously transmitted and received,
   wherein in the second mode, the radio frequency signal of the first frequency band and the radio frequency signal of the second frequency band are not simultaneously transmitted, are not simultaneously received, or are not simultaneously transmitted and received, and the radio frequency signal of the third frequency band and the radio frequency signal of the fourth frequency band are simultaneously transmitted, are simultaneously received, or are simultaneously transmitted and received,
   the first frequency band comprising one of the third frequency band and the fourth frequency band, and
   the second frequency band partially overlapping the other of the third frequency band and the fourth frequency band,
   the radio frequency module comprising:
   a common filter having a pass band that is the first frequency band;
   a first individual filter having a pass band that is the second frequency band;
   a second individual filter having a pass band that is the other of the third frequency band and the fourth frequency band; and
   a first switch circuit comprising a first common terminal, a first selection terminal, a second selection terminal, and a third selection terminal, the first switch circuit being configured to simultaneously connect the first common terminal to at least two of the first, second, and third selection terminals, wherein:
   the first selection terminal is connected to the common filter,
   the second selection terminal is connected to the first individual filter,
   the third selection terminal is connected to the second individual filter,
   when the radio frequency module operates in the first mode, the first common terminal is connected to the first selection terminal and to the second selection terminal, and the first common terminal is not connected to the third selection terminal, and when the radio frequency module operates in the second mode, the first common terminal is connected to the first selection terminal and to the third selection terminal, and the first common terminal is not connected to the second selection terminal.

2. The radio frequency module according to claim 1, further comprising:

a common receive filter;

a first individual receive filter; and a second individual receive filter, wherein:

when the radio frequency module operates in the first mode, a radio frequency signal of a first communication band and a radio frequency signal of a second communication band are simultaneously transmitted, are simultaneously received, or are simultaneously transmitted and received, and a radio frequency signal of a third communication band and a radio frequency signal of a fourth communication band are not simultaneously transmitted, are not simultaneously received, or are not simultaneously transmitted and received, when the radio frequency module operates in the second mode, the radio frequency signal of the first communication band and the radio frequency signal of the second communication band are not simultaneously transmitted, are not simultaneously received, or are not simultaneously transmitted and received, and the radio frequency signal of the third communication band and the radio frequency signal of the fourth communication band are simultaneously transmitted, are simultaneously received, or are simultaneously transmitted and received, the first communication band, the second communication band, the third communication band, and the fourth communication band each comprise a transmit band and a receive band, the first frequency band is the transmit band of the first communication band, the second frequency band is the transmit band of the second communication band, the third frequency band is the transmit band of the third communication band, the fourth frequency band is the receive band of the fourth communication band, the transmit band of the first communication band comprises a second transmit band, the second transmit band being one of the transmit band of the third communication band and the transmit band of the fourth communication band, a first receive band comprises a second receive band, or the second receive band comprises the first receive band, the first receive band being one of the receive band of the first communication band and the receive band of the second communication band, the second receive band being one of the receive band of the third communication band and the receive band of the fourth communication band, the common filter is a common transmit filter having a pass band that is the first transmit band, the first individual filter is a first individual transmit filter having a pass band that is the transmit band of the second communication band, the second individual filter is a second individual transmit filter having a pass band that is the other of the transmit band of the third communication band and the transmit band of the fourth communication band, a pass band of the common receive filter is one of the first receive band and the second receive band, whichever has a wider bandwidth, a pass band of the first individual receive filter is the other of the receive band of the first communication band and the receive band of the second communication band, a pass band of the second individual receive filter is the other of the receive band of the third communication band and the receive band of the fourth communication band, the first selection terminal is connected to the common transmit filter and to the common receive filter, the second selection terminal is connected to the first individual transmit filter and to the first individual receive filter, the third selection terminal is connected to the second individual transmit filter and to the second individual receive filter, the pass band of the first individual transmit filter or the pass band of the first individual receive filter partially overlaps the pass band of the second individual transmit filter and the pass band of the second individual receive filter, when the radio frequency module operates in the first mode, when the radio frequency signal of the first communication band and the radio frequency signal of the second communication band are simultaneously transmitted, are simultaneously received, or are simultaneously transmitted and received, the first common terminal is connected to the first selection terminal and to the second selection terminal, and the first common terminal is not connected to the third selection terminal, and when the radio frequency module operates in the second mode, when the radio frequency signal of the third communication band and the radio frequency signal of the fourth communication band are simultaneously transmitted, are simultaneously received, or are simultaneously transmitted and received, the first common terminal is connected to the first selection terminal and to the third selection terminal, and the first common terminal is not connected to the second selection.

3. The radio frequency module according to claim 2, wherein:

the transmit band of the first communication band comprises the transmit band of the third communication band, and the receive band of the second communication band comprises the receive band of the third communication band, the pass band of the common transmit filter is the transmit band of the first communication band, the pass band of the common receive filter is the receive band of the second communication band, the pass band of the first individual transmit filter is the transmit band of the second communication band, the pass band of the first individual receive filter is the receive band of the first communication band, the pass band of the second individual transmit filter is the transmit band of the fourth communication band, and the pass band of the second individual receive filter is the receive band of the fourth communication band.

4. The radio frequency module according to claim 2, wherein the pass band of the first individual transmit filter partially overlaps the pass band of the second individual receive filter.

5. The radio frequency module according to claim 2, wherein the pass band of the first individual receive filter partially overlaps the pass band of the second individual transmit filter.

6. The radio frequency module according to claim 2, further comprising:
a second switch circuit comprising a second common terminal, a fourth selection terminal, and a fifth selection terminal, the second switch circuit being configured to switch a connection of the second common terminal mutually exclusively between a the fourth selection terminal and the fifth selection terminal; and
a transmit amplifier configured to amplify a radio frequency signal, wherein:
the second common terminal is connected to an output port of the transmit amplifier,
the fourth selection terminal is connected to an input port of the first individual transmit filter, and
the fifth selection terminal is connected to an input port of the second individual transmit filter.

7. The radio frequency module according to claim 2, further comprising:
a third switch circuit comprising a third common terminal, a sixth selection terminal, and a seventh selection terminal, the third switch circuit being configured to switch a connection the third common terminal mutually exclusively between the sixth selection terminal and the seventh selection terminal; and
a receive amplifier configured to amplify a radio frequency signal, wherein:
the third common terminal is connected to an input port of the receive amplifier,
the sixth selection terminal is connected to an output port of the first individual receive filter, and
the seventh selection terminal is connected to an output port of the second individual receive filter.

8. The radio frequency module according to claim 2, wherein the first communication band is Band 3 of Long Term Evolution (LTE), and the second communication band is Band 1 of LTE.

9. The radio frequency module according to claim 2, wherein the third communication band is Band 4 of Long Term Evolution (LTE), and the fourth communication band is Band 2 of LTE.

10. The radio frequency module according to claim 2, wherein:
the first communication band is Band 3 of Long Term Evolution (LTE),
the second communication band is Band 1 of LTE,
the third communication band is Band 66 of LTE, and
the fourth communication band is Band 25 of LTE.

11. A communication device comprising:
a radio frequency (RF) signal processing circuit configured to process a radio frequency signal being transmitted or received by an antenna; and
the radio frequency module according to claim 1 configured to transmit the radio frequency signal between the antenna and the RF signal processing circuit.

* * * * *